(12) United States Patent
Shah et al.

(10) Patent No.: US 8,379,082 B2
(45) Date of Patent: Feb. 19, 2013

(54) SYSTEM, METHODS AND APPARATUS FOR SUBSTRATE CARRIER CONTENT VERIFICATION USING A MATERIAL HANDLING SYSTEM

(75) Inventors: Vinay K. Shah, San Mateo, CA (US); Sushant S. Koshti, Sunnyvale, CA (US); Eric A. Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1022 days.

(21) Appl. No.: 12/398,178

(22) Filed: Mar. 4, 2009

(65) Prior Publication Data
US 2009/0225160 A1 Sep. 10, 2009

Related U.S. Application Data

(60) Provisional application No. 61/033,790, filed on Mar. 5, 2008.

(51) Int. Cl.
*H04N 7/18* (2006.01)
*G06K 9/00* (2006.01)

(52) U.S. Cl. .............. 348/94; 382/145; 382/151
(58) Field of Classification Search ............ 348/94; 382/145, 151
See application file for complete search history.

(56) References Cited

U.S. PATENT DOCUMENTS

| | | | |
|---|---|---|---|
| 5,933,521 A | 8/1999 | Pasic | |
| 7,015,492 B2 * | 3/2006 | Garssen et al. | 250/559.4 |
| 7,202,491 B2 | 4/2007 | Garssen et al. | |
| 2006/0051184 A1 | 3/2006 | Elliott | |
| 2008/0156689 A1 | 7/2008 | Koshti et al. | |

FOREIGN PATENT DOCUMENTS
JP 10-270526 10/1998

* cited by examiner

*Primary Examiner* — Aaron Strange
(74) *Attorney, Agent, or Firm* — Dugan & Dugan, PC (57) ABSTRACT

Methods and systems are provided for mapping substrates in a substrate carrier. The invention includes a substrate carrier including one or more windows; and an imaging system coupled to a substrate carrier handling robot and adapted to determine or image substrate positions in the substrate carrier via the one or more windows. Numerous other aspects are provided.

16 Claims, 7 Drawing Sheets

SYSTEM, METHODS AND APPARATUS FOR SUBSTRATE CARRIER CONTENT VERIFICATION USING A MATERIAL HANDLING SYSTEM

RELATED APPLICATIONS

The present application claims priority to U.S. Provisional Patent Application No. 61/033,790, filed Mar. 5, 2008, and entitled "SUBSTRATE CARRIER CONTENT VERIFICATION USING A MATERIAL HANDLING SYSTEM", which is hereby incorporated herein by reference in its entirety for all purposes.

FIELD OF THE INVENTION

The present invention relates generally to electronic device manufacturing, and more particularly to methods and apparatus for substrate carrier transportation and the detection and verification of the contents of the substrate carrier.

BACKGROUND OF THE INVENTION

Processing of substrates (e.g., semiconductor, glass, etc.) for use in electronic devices is typically done in one or more processing systems. Although multiple processing steps may be performed in a single processing system, substrates typically may be transported between processing systems for at least some of the processing steps.

Substrates generally are stored in cassettes or pods (hereinafter referred to collectively as "substrate carriers") for transfer from one processing system to another, and between processing systems and other locations, such as storage locations. A substrate carrier may also be described in the art as a Front Opening Unified Pod (FOUP) or cassette. Each carrier may incorporate a plurality of 'slots,' or features designed to support a substrate in a pre-determined location, with suitable space between adjacent slots. Although substrate carriers may be carried manually between processing systems, the transfer of substrate carriers is typically automated. For instance, automatic handling of a substrate carrier may be performed by an automated material handling robot or vehicle, which may deliver and retrieve substrate carriers from a load port of a process tool, for example. The transfer robot or vehicle may be part of an Automated Material Handling System (AMHS). The contents of the substrate carrier are typically verified by "substrate mapping." A need exists for improved methods and apparatus for substrate carrier content mapping.

SUMMARY OF THE INVENTION

In some aspects, a system is provided for mapping substrates in a substrate carrier. The system includes a substrate carrier including one or more windows; and an imaging system coupled to a substrate carrier handling robot and adapted to image substrate positions in the substrate carrier via the one or more windows.

In further aspects, a system for mapping substrates in a substrate carrier is provided which includes a substrate carrier robot; and an imaging system mounted to the substrate carrier handling robot and adapted to image a substrate in the substrate carrier via one or more windows formed in a substrate carrier.

In other aspects, a substrate carrier is provided. The substrate carrier includes a substrate carrier body including a first end including a door, and a second end opposite the first end, wherein the second end includes a window formed therein adapted to allow imaging of a substrate in the carrier, wherein the window includes one or more reference features.

In yet other aspects, a method for mapping substrates in a substrate carrier is provided. The method comprises providing an imaging system coupled to a substrate carrier handling robot; supporting a substrate carrier via the substrate carrier handling robot; and imaging substrate positions in the substrate carrier via one or more windows in the substrate carrier.

Other features and aspects of the present invention will become more fully apparent from the following detailed description, the appended claims and the accompanying drawings.

DETAILED DESCRIPTION

The following detailed examples depict several exemplary embodiments of the present invention. Although in some cases the description may seem to imply the invention may only be practiced in one way, it should be understood that many alternative embodiments are possible and that specific details disclosed herein are merely provided as examples.

In a modern semiconductor fabrication facilities (fabs), multiple pieces of work material (e.g., silicon substrates, glass, etc.) are transported in substrate carriers. The substrate carriers are delivered to the process equipment by an Automated Material Handling System (AMHS), for example, and the process equipment may open the substrate carrier within an environmentally controlled area, and then the contents of the substrate carrier may be detected and verified by "substrate mapping." The normal mapping results for the contents of the substrate carrier are that a substrate may be 'present' or 'absent' (not detected) in one or more (depending on the capacity of the carrier) storage slots within the substrate carrier. Abnormal mapping results or anomaly conditions for the contents of the substrate carrier may be that one or more substrates are detected in a location that is 'shifted' from an expected location by an amount greater than a pre-set threshold; one or more slots may contain 'multiple' substrates; or one or more substrates within the substrate carrier may be present in a 'cross-slotted' orientation such that one substrate occupies more than one slot within the substrate carrier. Incorrectly detecting the normal map states can result in substrates being wasted, and incorrectly detecting the abnormal map states may result in damage to the equipment and or substrates. The most common method for substrate mapping is performed by scanning up-down near the front edge of the substrates using a through-beam sensor. The presence of a substrate in the substrate carrier is indicated by the breaking of the sensor beam. Another method in wide use is scanning up-down using laser reflective sensors, in which the reflection of a laser beam indicates the presence of a substrate. In both methods, the abnormal states mentioned above can also be detected. In practice today, the device that performs the mapping is either: 1) the load port, which is the device that opens/closes the substrate carrier, or 2) a substrate-handling robot, which is the device that will subsequently remove the individual substrates from the substrate carrier, after the load port has opened the substrate carrier, and deliver the individual substrates to the process equipment.

A problem with the conventional method is that if the mapping is performed by the load port, the cost may be significant. Each process tool may have between two and five load ports. If mapping is performed by the load port, then there must be two to five substrate mappers at each process tool (the same as the number of load ports), and each substrate mapper may be in use for only a very small percentage of time during the manufacturing process—typically 1% to 3% or less. Accordingly, the substrate mapper may be idle for the remainder of time. Load port manufacturers have implemented mapping mechanisms such that the mapping is performed while the substrate carrier door is being opened; therefore, the throughput/cycle time is not affected by the mapping task. However, these mechanisms, along with the sensors themselves, add significant cost to each load port.

Another problem with conventional mapping methods is that if the mapping is performed by the substrate-handling robot, throughput may be affected since the substrate-handling robot will be saddled with the additional task of mapping the substrates of each substrate carrier after it opens, in addition to the main task of moving substrates between the substrate carriers and the process tool, thus possibly adding to the cycle time.

Furthermore, substrate-handling robots that perform substrate mapping typically have the one or more sensors built into the same robot end effector that is used for substrate handling. For example, usually, a laser/light source is located in a body, arm, or wrist of the substrate-handling robot, and a light is channeled via optical fibers and lenses to the tips of an end effector of the substrate-handling robot. In some cases, this laser/light source positioning also presents a problem because the substrates can be extremely hot after processing, and exposure of the optical fibers, lenses, etc. to heat may cause deteriorated performance. In addition, the thin-ness of the substrate-handling robot end effector is often limited due to the routing of the optical fibers through the end effector thereby making it problematic to implement such mapping capabilities on the end effector.

In conventional semiconductor factories, each substrate carrier may have a maximum capacity for 25 substrates, the substrate carriers are typically filled at or near full capacity, and each process tool has 2-5 load ports (most have 3). Under these conditions, the problems outlined above have been manageable, although not desirable. In the future, electronic device manufacturing facilities will likely change to small-lot manufacturing, in which case the substrate carrier capacity will be drastically reduced—possibly to only one or two substrates per substrate carrier. (As used herein, small-lot substrate carriers refer to substrate carriers that have a maximum capacity that is significantly less than the maximum capacity of conventional large-lot substrate carriers. For example, conventional large-lot substrate carriers typically have a maximum capacity of 13 or 25 substrates while small-lot substrate carriers, according to the present invention, have a maximum capacity of less than 13 substrates (e.g., 1, 2, 3, 4, 5, 6, 7, etc. substrates). As an example, in one embodiment, a small-lot size substrate carrier is adapted to hold a maximum capacity of 5 or less substrates. In some embodiments, a small-lot size substrate carrier is adapted to hold a maximum capacity of 2 or less substrates. Other small-lot size carriers may be employed. In general, each small-lot size substrate carrier may hold too few substrates for human transport of substrate carriers to be viable within a semiconductor device manufacturing facility.

In the case of manufacturing using small-lot substrate carriers, the number of load ports at each tool will need to increase (e.g., 6 to 12 per tool). If substrate mapping continues to be performed by the load ports, then the cost of mapping will increase by approximately 3 times, corresponding to the increase in the number of load ports, since each load port may still need a substrate mapper. If substrate mapping continues to be performed by the substrate-handling robot, then the throughput impact may become much higher, since the substrate-handling robot may be required to perform a substrate map once for every 2 substrates in the small-lot substrate carrier (instead of once for every 25 substrates as is currently the case with the large-lot substrate carriers). Under these conditions, the problems described above are no longer manageable. Therefore, a method for substrate mapping is needed that does not impact the throughput of the process tool, and/or which may also reduce a number of substrate mapping devices that are needed for each process tool.

One such method may be to build the substrate mapping device into components of the AMHS, so that the AMHS can map the contents of the substrate carrier, such as while it is delivering the substrate carrier to the load port. In this embodiment, the AMHS may then report the mapping results either directly to the process tool, to the load port, or to the factory host (which may then relay the information to the process tool). Since the AMHS does not open the substrate carrier, the substrate carrier may have one or more windows or view ports (either of which are referred to as a "window" herein) adapted to allow the AMHS to detect the substrate carrier contents.

Among other features, the present invention may enable mapping the contents of a substrate carrier, such as a small-lot substrate carrier, while the substrate carrier is closed; mapping the contents of the substrate carrier while the substrate carrier is being delivered to a process tool; using reference features on the substrate carrier to assist the image processing algorithm and prevent incorrect map results, when a camera and image processing are used to perform the map operation; performing the map operation with a sensor that is fixed in position relative to the substrate carrier while the map is being performed; incorporating features into the substrate carrier to prevent reflected light from affecting sensor functionality; and using external light sources mounted so that light is not reflected back to the camera/sensor. Other features and aspects of the present invention will become more fully apparent from the following detailed description, the appended claims and the accompanying drawings.

Figure 1:
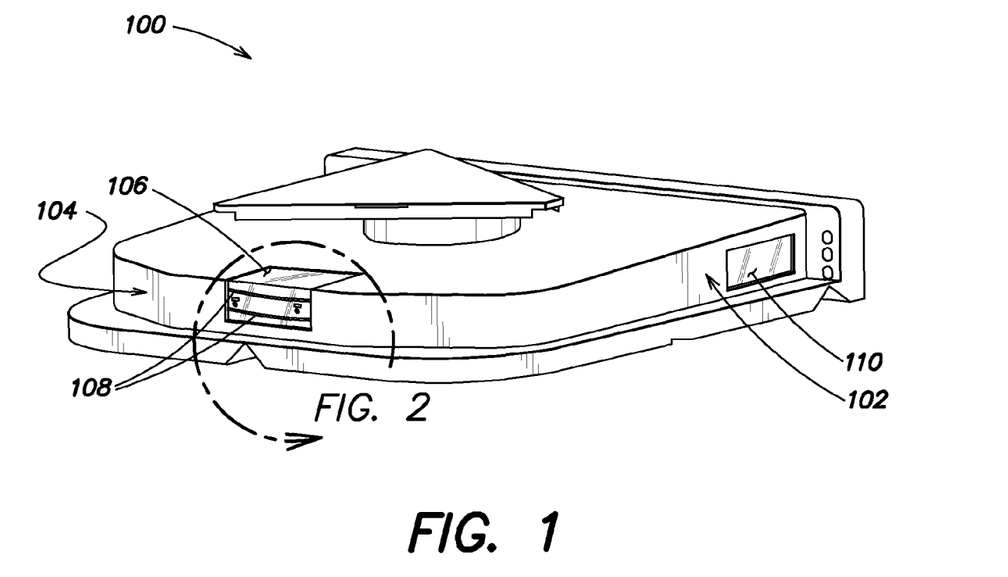
FIG. 1 is a perspective rear view of a substrate carrier according to some embodiments of the present invention.

Turning to FIG. 1, a perspective rear view of a substrate carrier 100 is provided. As described above, the substrate carrier 100 may be a small-lot substrate carrier, having a maximum capacity that is significantly less than a conventional large-lot substrate carrier, which typically has a maximum capacity of 13 or 25 substrates. For example, small-lot substrate carriers, according to the present invention, may have a maximum capacity of less than 13 substrates (e.g., 1, 2, 3, 4, 5, 6, 7, etc. substrates). As an example, in one embodiment, a small-lot size substrate carrier is adapted to hold a maximum capacity of 5 or less substrates. In some embodiments, a small-lot size substrate carrier is adapted to hold a maximum capacity of 2 or less substrates. Other small-lot size carriers may be employed.

In some embodiments, the substrate carrier 100 may have first side 102 including a door, not shown, adapted to selectively provide access to the substrate carrier 100. The substrate carrier 100 may also include a second side 104, opposed to the first side 102. The second side 104 may include one or more windows 106 which may take the form of transparent portions of the substrate carrier 100. In some embodiments the window 106 or transparent portion of the substrate carrier 100 may be at least semi-transparent or translucent. The translucent window 106 may be colored, for example. In some embodiments, the window 106 may provide viewing access for an imaging system 308 (FIG. 3), which may include a CCD camera, a CMOS camera, or other type of camera, sensor(s) or device adapted to look into, and view inside of, the substrate carrier 100. As will be further described below, an image processing algorithm may then determine the contents of the substrate carrier 100 based on the image of the imaging system. In some embodiments, the imaging software may capture an image of the contents of the substrate carrier. From this captured/detected image, the software may confirm the normal presence of a substrate in the field of view. In the instances of a substrate 'present' map result, the detected location of a substrate in the image may correspond to the expected location of a certain slot, and the detected thickness of the substrate may correspond to the presence of a single substrate in that location. If no substrate is detected in the expected location of a particular slot, then the map result for that particular slot is reported as 'absent.' The imaging software may also detect an abnormal map result by determining that the captured/detected deviates from an expected image, either by using preset information, or by comparing detected information with the reference features shown in FIGS. 6A and 7A, described below. In some embodiments, the imaging system 308 may include a controller to perform the image processing algorithm. In other embodiments, the imaging system 308 may send a signal to an external controller 310 (FIG. 3), for example, which may perform the image processing algorithm. The controller 310 may be an electronic logic board, microcontroller such as a single-chip microcontroller, microprocessor, or the like. In some embodiments, an interior of the substrate carrier 100 may include one or more slots (not shown); each slot may be adapted to support a single substrate 108, such as in a horizontal orientation within the substrate carrier 100. For each slot in the substrate carrier 100, the algorithm may be able to detect whether the slot is empty, occupied by a single substrate 108, shown herein, occupied by more than one substrate (anomaly condition), or cross-slotted (anomaly condition), or a substrate is shifted (anomaly condition).

In some embodiments, an external light source (not shown) may be used for the mapping application. Such an external light source may be attached in a manner so that the light emitted does not reflect back into the imaging system 308, or the light is emitted in a direction that is not aligned with the imaging system 308. In one such embodiment, the external light sources may illuminate the inside of the substrate carrier 100 through a plurality of side windows 110, described further below, while the imaging system 308 looks in through a window 106 (such as a rear window) that is not aligned with the light source.

Additionally, light reflected from the window 106, 110 in the substrate carrier 100 described above, may affect the imaging system 308 functionality. Some embodiments may incorporates either or both of the following: suitable means to reduce or eliminate reflected light, such as anti-reflective coatings formed on or in the window 106, 110, and/or designing the window 106, 110 to prevent light being reflected back to the imaging system 308. This may be achieved by giving the windows 106, 110 a suitable slope, for example. Optionally, the window 106, 110 may include a shape such that light is reflected away from the imaging system 308.

Figure 2:
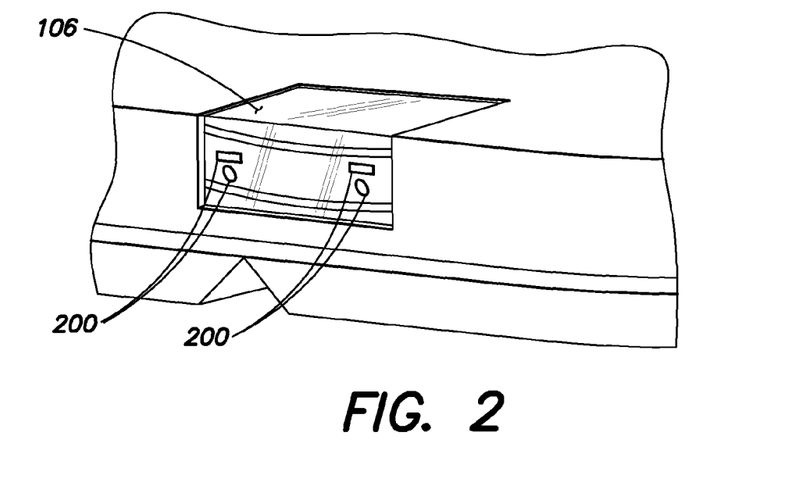
FIG. 2 is an enlarged partial schematic perspective view of a window of a substrate carrier including reference features according to some embodiments of the present invention.

In some embodiments, the substrate carrier 100 or substrate carrier window 106 may include one or more additional features 200 (FIGS. 2A, 2B). The features 200 may include, for example, a marking, a raised or indented element, a groove, a notch, or a hole. Other suitable features may be used. The features may provide a reference for the location as well as the state of a substrate (for example, its expected thickness). The features 200 may be incorporated into the window 106 or provided alongside of the window 106, such as on the body 105 of the substrate carrier 100 adjacent to the window 106. The features 200 may be visible to the imaging system 308 and may be located within the imaging system's nominal field of view (when the imaging system 308 is looking through the window 106 at the substrates 108). The features 200 may be reference features used by the image processing algorithm to determine the orientation of the substrate carrier 100 relative to the imaging system 308, or the features 200 may be used to determine the distance to the substrate carrier 100 from the imaging system 308, or the features 200 may be used to help distinguish scratches, dirt, etc. on the substrate carrier window 106, etc. The use of the features 200 will be described further below with respect to FIGS. 6A, 6B, 7A and 7B.

Figure 3:
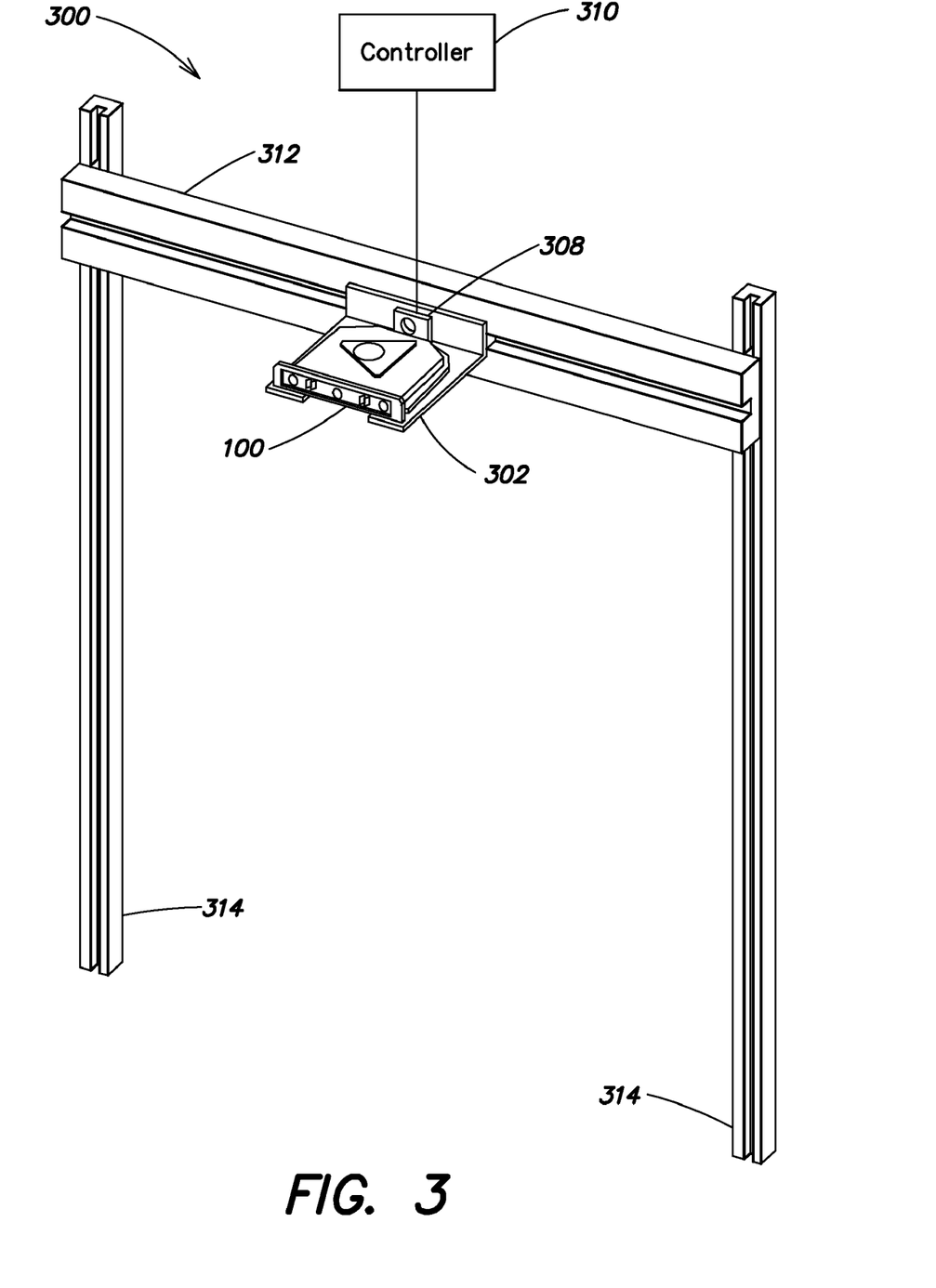
FIG. 3 is a schematic perspective view of a substrate carrier and a handling robot according to some embodiments of the present invention.
Figure 4:
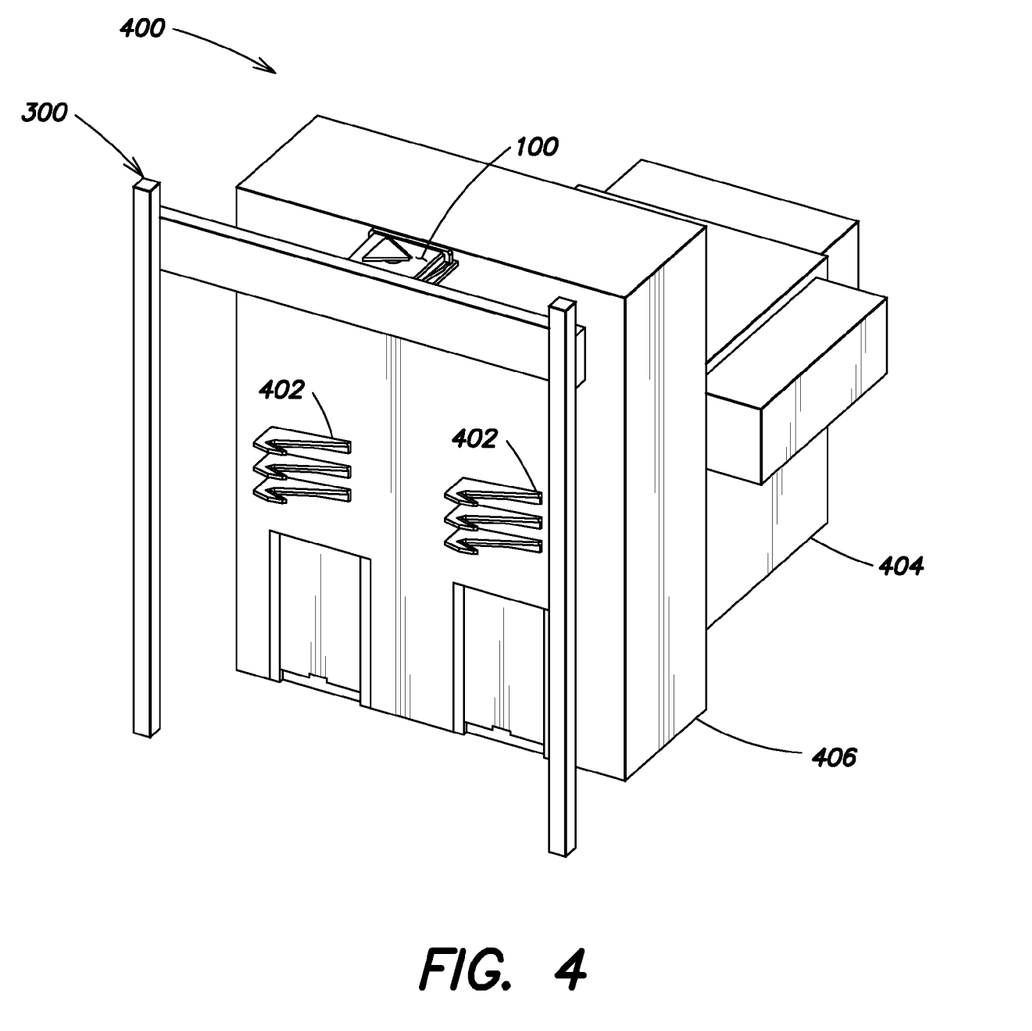
FIG. 4 is a schematic perspective view of a substrate carrier and handling robot at a process tool according to some embodiments of the present invention.

Turning to FIG. 3, a schematic perspective view of a substrate carrier 100 and a substrate carrier handling robot 300 according to some embodiments of the present invention is provided. The substrate carrier handling robot 300 may be any type of robot adapted to carry the substrate carrier 100 to and from the load port 402 of a process tool 404 (FIG. 4). For example, the robot may be an AMHS robot, hereinafter a "carrier handling robot 300," (e.g., a Tool Station robot) and may include an end effector 302 (e.g., the Tool Station robot end effector), which may move left-right/right-left and up-down/down-up relative to the load port location. The end effector 302 may be adapted to support the small-lot substrate carrier 100 and may deliver, for example, small-lot substrate carriers 100 to a load port 402 (FIG. 4). In some embodiments, the end effector 302 may have the imaging system 308 mounted, or coupled, in a fixed position thereon. The imaging system 308 may look at the window 106, and view an interior of the substrate carrier 100 when the substrate carrier 100 is being held by the end effector 302. In other embodiments, the imaging system 308 may be mounted or coupled to other components of the carrier handling robot 300 in a position where the window 106 is readily viewed.

Again referring to FIG. 3, in some embodiments, the carrier handling robot 300 may also include a horizontal member 312, which may include an actuator or other suitable mechanism adapted to move the end effector 302 and substrate carrier 100 supported thereby in a horizontal direction. For example, the end effector 302 may be mounted to a follower member that moves within a guide channel or on linear bearing and a suitable motive device which is operative to move the follower member along the guide channel or linear bearing in the horizontal direction. Any suitable mechanism may be used to accomplish the linear movement, such as a linear actuator, positioning stage, a lead screw mechanism, a chain and drive mechanism, belt and pulley mechanism, a gear and teeth mechanism or the like. Furthermore, one or more vertical members 314 may be adapted to allow vertical motion of the end effector 302 and the substrate carrier 100 supported thereon. As in the horizontal member, any suitable mechanism may be utilized to cause the vertical motion of the end effector 302 and the substrate carrier 100. In some embodiments, the horizontal member 312 is caused to move vertically in a guide channel or on linear bearing formed in the vertical direction on one or both of the vertical members 312. Any suitable motive member may cause the vertical motion of the member 312, such as those described above.

Conventional attempts to employ cameras and image processing to map the substrate carrier contents have been relatively unsuccessful. In such attempts, a camera was used to look into the front of a substrate carrier when the door is removed. It was found that the camera may need to be very close to the substrates in order to accurately map the substrate carrier due to lighting requirements, resolution requirements, and other issues. It was particularly difficult, if not impossible, to accurately map a large-lot capacity substrate carrier with a camera that is fixed in position relative to the substrate carrier, because the field of view that provides accurate mapping results is not big enough to see all the substrate locations. However, using a small-lot substrate carrier, as in the present invention, there are only a few substrates to be seen, so the field of view can easily encompass all substrate positions. Thus, the present invention enables closed substrate carrier mapping using imaging in part because the substrate carriers 100 used are small-lot capacity and a fixed imaging system 308 may be located close enough to the substrates 108 to accurately image all substrate locations.

Turning to FIG. 4, a system 400 is depicted including the carrier handling robot 300 positioned in front of a typical process tool 404. A process tool Equipment Front End Module (EFEM) or factory interface 406 may be positioned between the carrier handling robot 300 and the process tool 404. The process tool EFEM 406 may include a substrate handling robot (not shown), which may remove/replace the substrates 108 from/into the substrate carriers 100 docked at the load ports 402. In operation, the carrier handling robot 300 may receive a substrate carrier 100 from other AMHS components, and may then move the substrate carrier 100 either to a storage location (not shown) or to the load port 402. While the substrate carrier 100 is being supported and held by the end effector 302, the imaging system 308 (FIG. 3) may capture an image of the substrate carrier rear window 106, and, in some embodiments send a signal to the controller 310, where the image processing algorithm can extract the substrate map information. This image capture and mapping may be performed at any time while the substrate carrier 100 is being held or supported by the end effector 302. For example, image capture and mapping may be performed while the carrier handling robot 300 is in motion toward the load port 402, or immediately upon picking up the substrate carrier 100 from the load port 402 or storage shelf, or immediately upon dropping off the substrate carrier 100 at a load port 402 or storage shelf, or immediately upon receiving the substrate carrier 100 from the other AMHS components.

Figure 5:
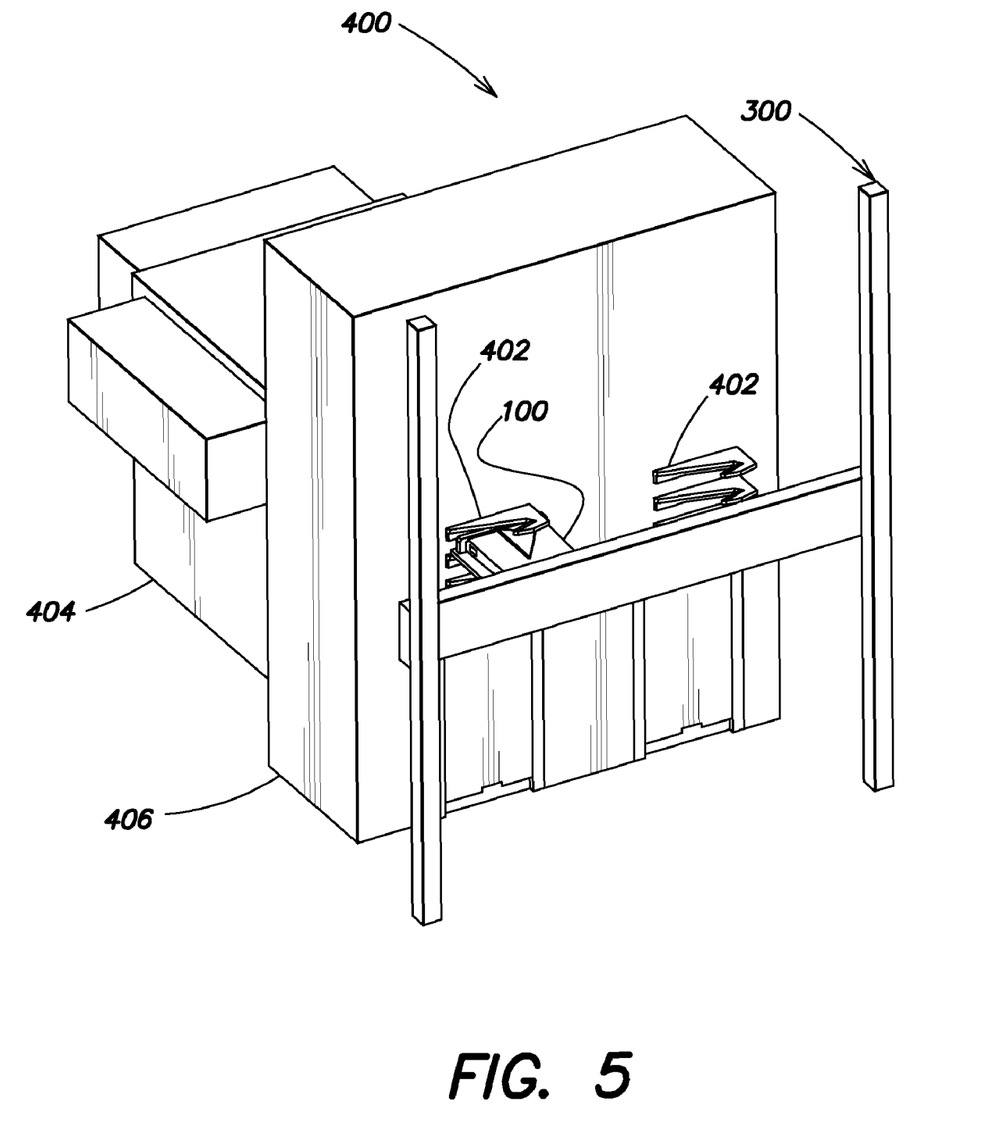
FIG. 5 is a schematic perspective view of a handling robot approaching a substrate carrier docked at a load port of a processing tool according to some embodiments of the present invention.

In addition, the carrier handling robot 300 may perform substrate mapping without actually picking up the substrate carrier 100, but by only approaching the substrate carrier 100 while the substrate carrier 100 is being held by another device. For example, turning to FIG. 5, a substrate carrier 100 is being held at a load port 402, and the carrier handling robot 300 has moved to the approach position behind this substrate carrier 100. In this position, the imaging system 308 (FIG. 3) can see through the substrate carrier rear window 106 exactly the same as if the substrate carrier 100 was being held by the AMHS robot 300. In this way, the substrate map may be determined or read while the substrate carrier 100 is positioned at or near the load port 402. The map may further be processed by the controller 310, for example. This type of imaging may be useful when mapping the substrate carrier 100 before closing the substrate carrier door. For example, the imaging and mapping may be performed after processing and after the substrates 108 have been returned to the substrate carrier 100, because the process tool 404 may want to verify, via the controller 310, for example, that all substrates 108 are back in the substrate carrier 100 before closing the substrate carrier door.

Other substrate mapping methods could also be incorporated into the AMHS components, such as the carrier handling robot 300, for example. For example, other imaging systems, such as a through-beam laser sensor, for example may be built into the carrier handling robot 300, and windows may be located on the substrate carrier 100 such that the sensors could transmit and receive signals through the substrate carrier 100 across the substrates 108. These signals may create a pseudo image of the contents of the substrate carrier 100. For example, as described above, the small-lot substrate carrier 100 shown in FIG. 1 may include two side windows 110 through which the through-beam laser could pass through the substrate carrier 100 and across the substrate(s) 108. Other suitable numbers of side windows 110 may be used. The through-beam may be scanned up/down to sense and provide an image or the substrate map. This method may require relative motion between the sensor and the substrate carrier 100. The system may be further adapted to account for potential false sensor readings that may be triggered by scratches, dirt or other changes in clarity of the window in the substrate carrier 100. In another embodiment, an imaging system, such as a through-beam laser line sensor (or array of single-beam laser sensors), may be used. This may not require relative motion between the sensor and substrate carrier 100. In another embodiment, an imaging system, such as a reflective sensor, for example, may be used. The reflective sensor may reduce the number of windows 106, 110 required in the substrate carrier 100. For example, only one side window may be required instead of the two side windows 110 used with a through-beam sensor, for example, but it may still require relative motion. Optionally, the sensor may be mounted on the carrier handling robot so as to sense the location of the substrate through the rear window 106.

Figure 6A:
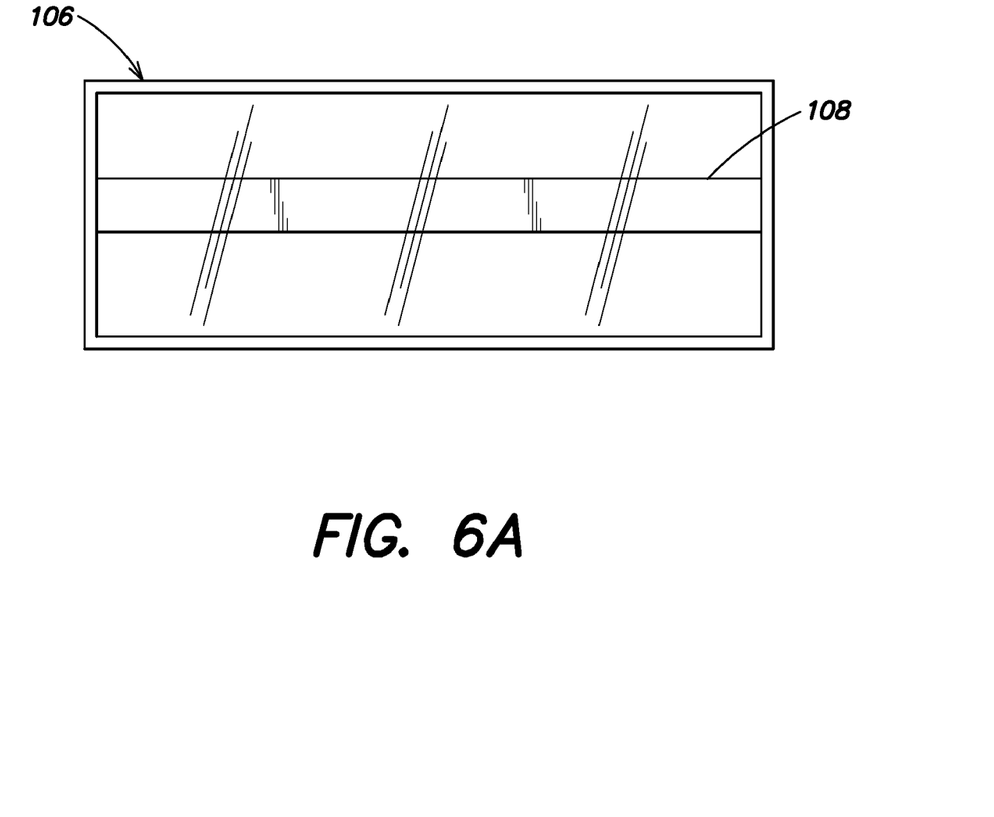
FIG. 6A is a schematic view through a window of a first example of a substrate carrier without reference features, from a camera perspective, according to some embodiments of the present invention.
Figure 6B:
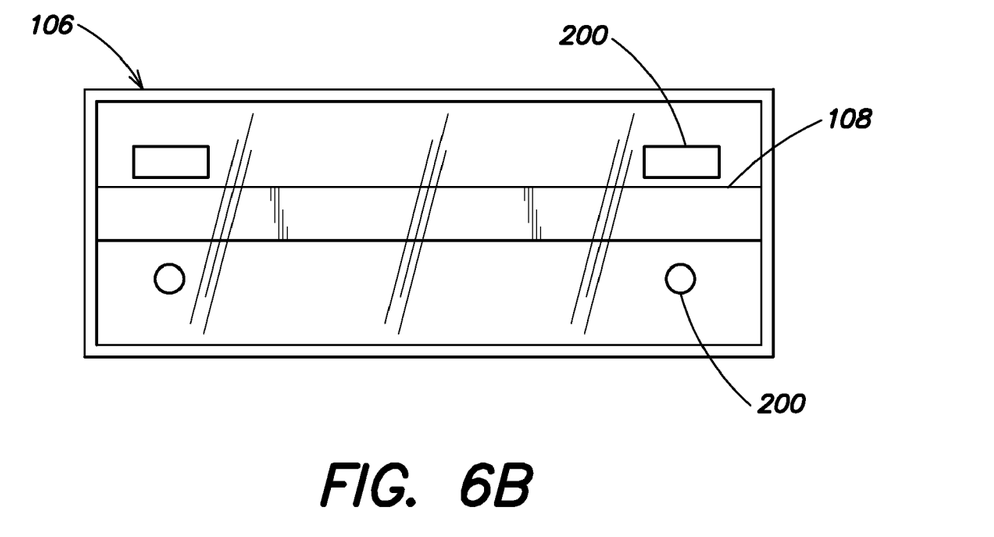
FIG. 6B is a schematic view through a window of a first example of a substrate carrier with reference features, from a camera perspective, according to some embodiments of the present invention.

Turning to FIGS. 6A and 6B, a first example of the operation and benefit of the window 106 including the features 200 is provided. FIGS. 6A and 6B show the imaging system view of a window 106 of a substrate carrier 100 containing one substrate 108, with and without features 200, respectively. The image in FIG. 6A does not contain any reference features 200, while the view in FIG. 6B does contain reference features 200. In FIG. 6A, the single substrate 108 is clearly identified, but it is not conclusively evident which slot the substrate 108 is in. Although each of the nominal substrate planes will typically be at the same height in the image for every substrate carrier 100, any anomalies such as if the substrate carrier 100 is not seated correctly on the end effector 302, if the imaging system 308 is slightly out of position or at a slight angle, etc. will cause the substrate planes to change in position. In FIG. 6B, the single substrate 108 is clearly identified along with the reference features 200 that conclusively show that the substrate 108 is in a desired slot (e.g., in slot #1). In addition, the reference features may provide a visual reference as to the thickness of the substrate 108, which may be used to verify that the detected image indeed depicts a single substrate 108, and not multiple substrates stacked on top of one another. The features 200 may include individual horizontally-spaced features, for example.

Figure 7A:
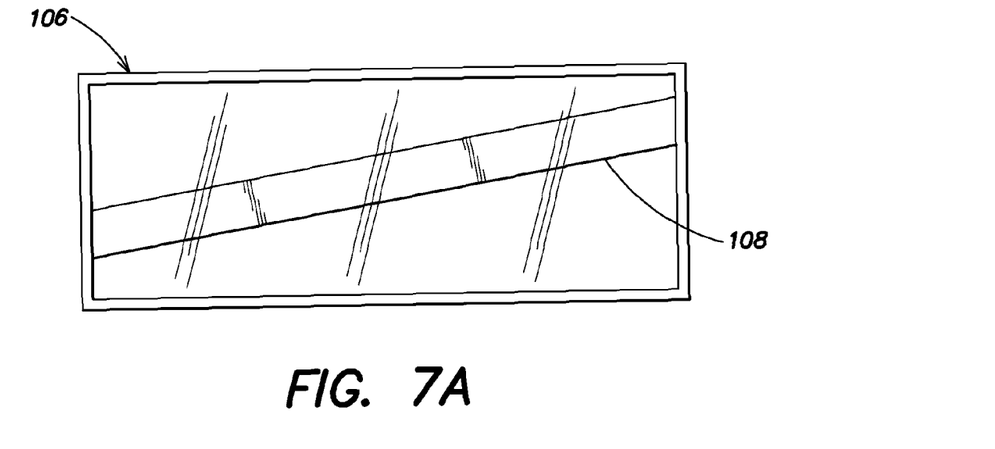
FIG. 7A is a schematic view through a window of a second example of a substrate carrier without reference features, from a camera perspective, according to some embodiments of the present invention.
Figure 7B:
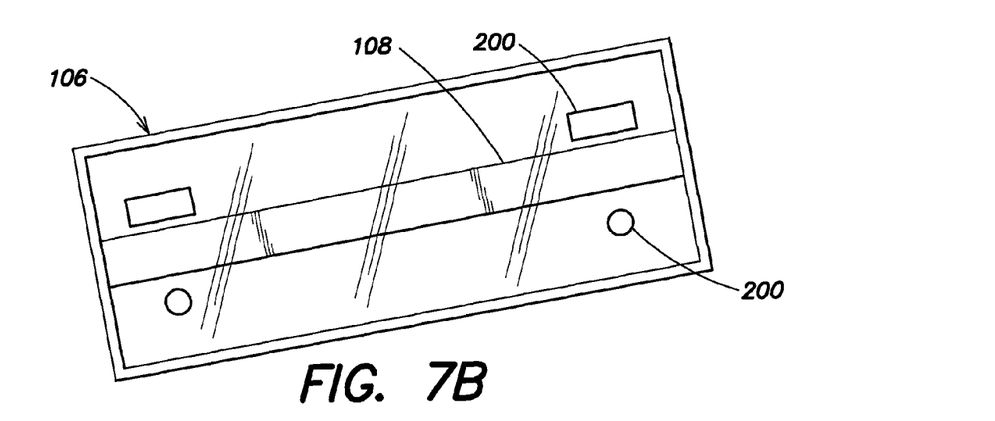
FIG. 7B is a schematic view through a window of a second example of a substrate carrier with reference features, from a camera perspective, according to some embodiments of the present invention.
Figure 7C:
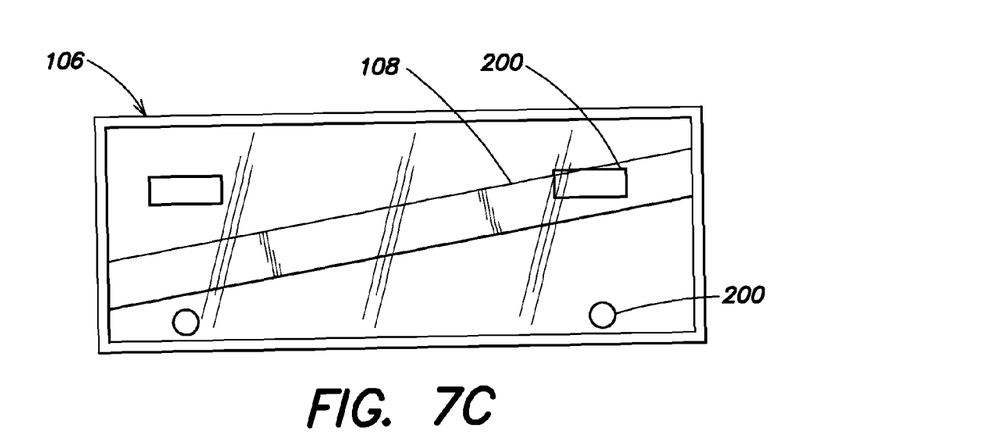
FIG. 7C is a schematic view through a window of a third example of a substrate carrier with reference features, from a camera perspective, according to some embodiments of the present invention.

Turning to FIGS. 7A and 7B, a second example, and in FIG. 7C, a third example, of the operation and benefit of the window 106 including the features 200 is provided. FIGS. 7A and 7B show the imaging system view of a substrate carrier 100 containing one substrate 108. The image in FIG. 7A does not contain any reference features 200, while the view in FIG. 7B does contain reference features 200. In FIG. 7A, the single substrate 100 is clearly identified, but it appears that the substrate 108 is cross-slotted, i.e., one end in one slot and another end in a lower slot. Although each of the nominal substrate planes will typically be in the same orientation in the image for every substrate carrier 100, any anomalies, such as if the substrate carrier 100 is not seated correctly on the end effector 302, if the imaging system 308 is slightly out of position or at a slight angle, etc., will cause the substrate planes to change in orientation. In FIG. 7B, the single substrate 108 is clearly identified along with the reference features 200 that conclusively show that the substrate is NOT cross-slotted. In other words, the substrate 108 is properly situated in the slot, but the substrate carrier 100, for example, may not be seated correctly on the end effector 302, or the imaging system 308 may be misaligned. It may be beneficial to determine the cause of the apparent mis-alignment such that the proper steps may be taken to rectify the error. For example, if the substrate is cross-slotted, or the substrate carrier is improperly positioned on the end effector 302, the processing may halt until the problem is rectified, so as not to damage the substrate 108 or processing tools 404 and equipment.

Turning to FIG. 7C, the position of the single substrate 108 compared to the reference features 200 show that the substrate 108 is cross-slotted. In other words, the substrate 108 is not properly positioned in the slot, as shown by the difference in orientations of the substrate 108 and the reference features.

Figure 8:
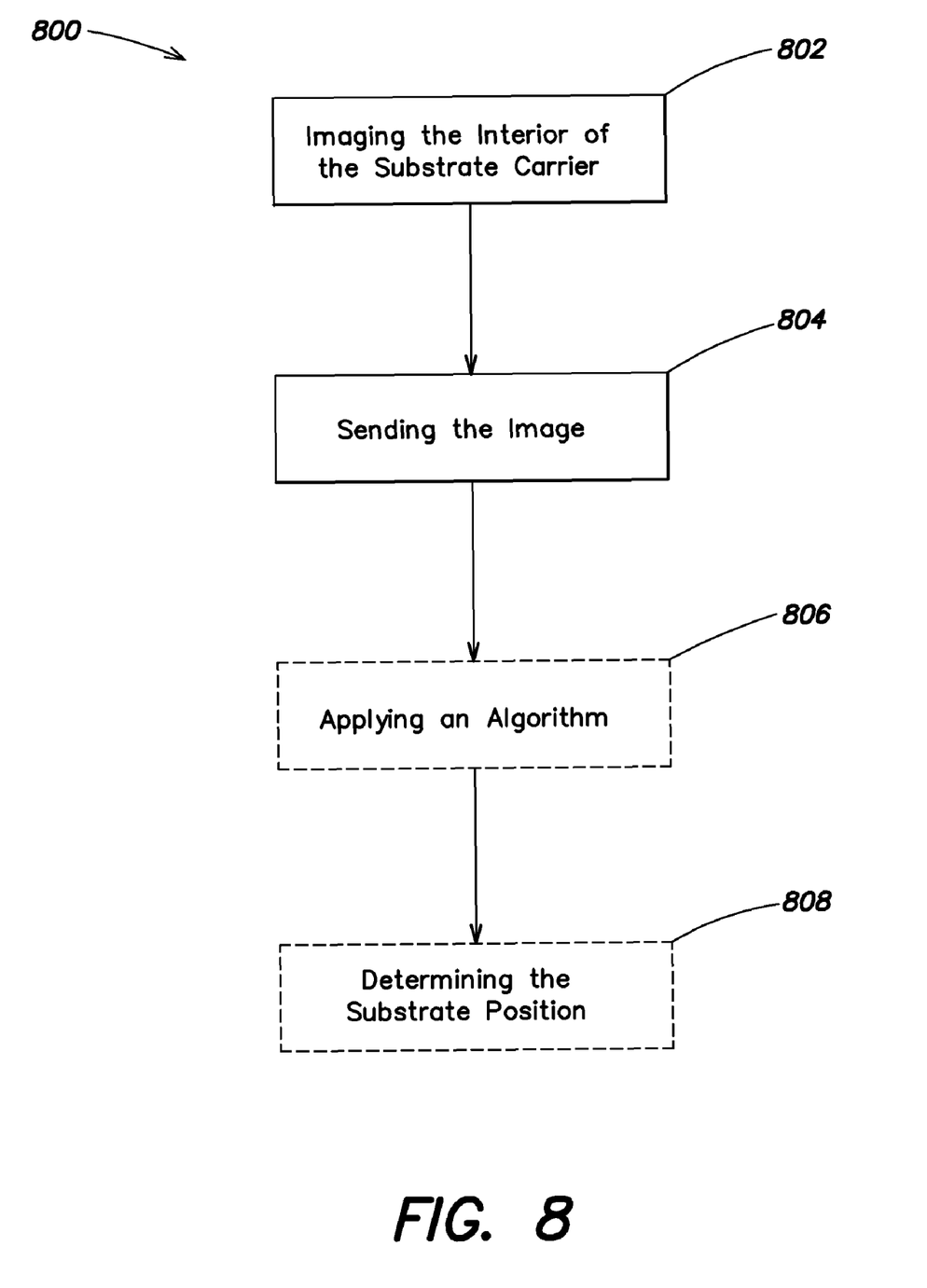
FIG. 8 is a flowchart depicting an exemplary method according to some embodiments of the present invention.

Turning to FIG. 8, an exemplary method 800 in which the interior of the substrate carrier 100 is mapped according to some embodiments is provided. The following specific method 800 is provided as an illustrative example and numerous other alternative and additional steps, sub-steps, and/or macro-steps may be possible. In 802 the imaging system, such as the camera or a sensor, takes an image or sends a signal through the one or more windows 106/110 in the substrate carrier 100 to view the interior of the substrate carrier 100. The image may be taken while the substrate carrier is closed, or while the substrate carrier is being delivered to a process tool, for example. The image or signal is sent to the controller 310 in 804. The controller 310 may apply an image processing algorithm to the image or signal and may extract the substrate map information in 806. The controller 310 may determine whether the substrate is properly slotted in the substrate carrier 100 in 808 based on the map information.

The foregoing description discloses only particular embodiments of the invention; modifications of the above disclosed methods and apparatus which fall within the scope of the invention will be readily apparent to those of ordinary skill in the art. For example, the present invention may also be applied to mapping substrates in large-lot capacity substrate carriers using multiple cameras or a moving camera mounted on the carrier handling robot. Accordingly, while the present invention has been disclosed in connection with specific embodiments thereof, it should be understood that other embodiments may fall within the spirit and scope of the invention, as defined by the following claims.

What is claimed is:

1. A system for mapping substrates in a substrate carrier comprising:
   a substrate carrier including one or more windows; and
   an imaging system coupled to a substrate carrier handling robot and adapted to image substrate positions in the substrate carrier via the one or more windows,
   wherein the substrate carrier includes one or more reference features positioned on the one or more windows.

2. The image system of claim 1 wherein the imaging system is positioned a fixed distance from the substrate carrier.

3. The system of claim 1 wherein the substrate carrier includes at least one of one rear window and at least two side windows.

4. The system of claim 3 wherein the imaging system further comprises one or more sensors adapted to transmit a signal through the at least two side windows.

5. The system of claim 1 wherein the imaging system further comprises a camera adapted to capture an image of the substrate positions in the substrate carrier via the one or more windows.

6. The system of claim 1 wherein the imaging system is adapted to image substrate positions while the substrate carrier is being transferred.

7. The system of claim 1 wherein the one or more reference features are adapted to orient the image of the substrate positions in relation to a slot in the substrate carrier.

8. A system for mapping substrates in a substrate carrier, comprising:
   a substrate carrier robot; and
   an imaging system mounted to the substrate carrier handling robot and adapted to image a substrate in the substrate carrier via one or more windows formed in a substrate carrier, wherein the substrate carrier includes one or more reference features positioned on the one or more windows.

9. A method for mapping substrates in a substrate carrier, comprising:
   providing an imaging system coupled to a substrate carrier handling robot;
   supporting a substrate carrier via the substrate carrier handling robot;
   providing reference features on one or more windows of the substrate carrier; and
   imaging substrate positions in the substrate carrier via one or more windows in the substrate carrier.

10. The method of claim 9 further comprising:
applying an imaging algorithm to the imaged positions.

11. The method of claim 10 wherein applying the imaging algorithm further comprises:
orienting the imaged position of the substrate relative to the reference features.

12. The method of claim 11 further comprising:
determining the substrate is properly positioned.

13. The method of claim 11 further comprising:
determining the substrate is cross-slotted.

14. The method of claim 11 further comprising:
determining the substrate carrier is improperly positioned.

15. The method of claim 9 wherein imaging substrate positions and delivering the substrate carrier to a load port occur at the same time.

16. The method of claim 9 further comprising:
providing the imaging system a fixed distance from the substrate carrier.

* * * * *